United States Patent
Müller et al.

(10) Patent No.: US 8,610,225 B2
(45) Date of Patent: Dec. 17, 2013

(54) RADIATION-RECEIVING SEMICONDUCTOR COMPONENT AND OPTOELECTRONIC DEVICE

(75) Inventors: Christian Müller, Deuerling (DE); Werner Kuhlmann, München (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 0 days.

(21) Appl. No.: 13/254,366

(22) PCT Filed: Mar. 10, 2010

(86) PCT No.: PCT/EP2010/053046
§ 371 (c)(1), (2), (4) Date: Sep. 30, 2011

(87) PCT Pub. No.: WO2010/103047
PCT Pub. Date: Sep. 16, 2010

(65) Prior Publication Data
US 2012/0007202 A1    Jan. 12, 2012

(30) Foreign Application Priority Data
Mar. 12, 2009  (DE) .......................... 10 2009 012 755

(51) Int. Cl.
*H01L 27/14* (2006.01)
*G01T 1/24* (2006.01)

(52) U.S. Cl.
USPC ............ 257/428; 257/E31.128; 257/E31.001; 257/E31.122; 250/370.01

(58) Field of Classification Search
CPC ................... H01L 27/14643; H01P 27/14683; Y02E 10/50
USPC ............ 257/431, 432, E31, 128, 428 M, 257/E31.001, E31.054, E31.122; 250/214.1, 226, 370.01
See application file for complete search history.

(56) References Cited

U.S. PATENT DOCUMENTS 3,996,461 A * 12/1976 Sulzbach et al. .......... 250/214 R
4,158,133 A    6/1979 Spaeth et al.
(Continued)

FOREIGN PATENT DOCUMENTS

DE    101 01 457 A1    7/2002
DE    10 2005 060 603 A1    6/2007
(Continued)

OTHER PUBLICATIONS

Lahiji et al., "A Batch-Fabricated Silicon Thermopile Infrared Detector", 1982, IEEE Transactions on Electron Devices, vol. ED-29, No. 1, pp. 14-22, Jan. 1982.*

(Continued)

*Primary Examiner* — Nikolay Yushin
(74) *Attorney, Agent, or Firm* — Slater & Matsil, L.L.P.

(57) ABSTRACT

A radiation-receiving semiconductor component is specified. A semiconductor body is formed with silicon and has a radiation entrance surface and also an absorption zone. Electromagnetic radiation passes into the semiconductor body through the radiation entrance surface and is absorbed. The absorption zone has a thickness of at most 10 μm. A filter layer is formed with a dielectric material. The filter layer covers the radiation entrance surface of the semiconductor body. A potting body covers the semiconductor body at least at the radiation entrance surface thereof. The potting body contains a radiation-absorbing material.

20 Claims, 2 Drawing Sheets

(56) References Cited

U.S. PATENT DOCUMENTS

| | | | |
|---|---|---|---|
| 5,051,804 A * | 9/1991 | Morse et al. | 257/463 |
| 5,149,956 A * | 9/1992 | Norton | 257/188 |
| 7,897,920 B2 * | 3/2011 | Kierse et al. | 250/338.1 |
| 2002/0043613 A1 | 4/2002 | Suzuki et al. | |
| 2003/0218175 A1 | 11/2003 | Ogawa et al. | |
| 2005/0041292 A1 * | 2/2005 | Wheatley et al. | 359/584 |
| 2006/0049533 A1 * | 3/2006 | Kamoshita | 264/1.7 |
| 2006/0284165 A1 * | 12/2006 | Berger et al. | 257/25 |
| 2007/0063145 A1 * | 3/2007 | Kierse et al. | 250/370.14 |
| 2007/0108545 A1 | 5/2007 | Chua et al. | |
| 2008/0088722 A1 | 4/2008 | Takeichi | |

FOREIGN PATENT DOCUMENTS

| | | |
|---|---|---|
| EP | 1 589 586 A1 | 10/2005 |
| GB | 1 590 865 A | 6/1981 |
| JP | 56-165369 A | 12/1981 |
| JP | 61-113287 A | 5/1986 |
| JP | 04-049676 A | 2/1992 |
| WO | WO 2004/093200 A1 | 10/2004 |

OTHER PUBLICATIONS

Horne et al., "IR filters for TPV converter modules", 1996, AIP Conf. Proc., vol. 358, pp. 35-51 (Mar. 1996).*

Rüth, C., et al., "High accuracy Ambient Light Sensor SFH 5711," Osram Opto Semiconductors GmbH, Application Note, www.osram-os.com, Aug. 18, 2006, 9 pages.

"Ambient Light Sensor SFH 5711," Osram Opto Semiconductors GmbH, Product Flyer, www.osram-os.com/ambient-light-sensor/, Mar. 2007, 2 pages.

* cited by examiner

RADIATION-RECEIVING SEMICONDUCTOR COMPONENT AND OPTOELECTRONIC DEVICE

This patent application is a national phase filing under section 371 of PCT/EP2010/053046, filed Mar. 10, 2010, which claims the priority of German patent application 10 2009 012 755.0, filed Mar. 12, 2009, each of which is incorporated herein by reference in its entirety.

TECHNICAL FIELD

A radiation-receiving semiconductor component is specified. Furthermore, an optoelectronic device comprising such a radiation-receiving semiconductor component is specified.

SUMMARY OF THE INVENTION

In one aspect, the present invention specifies a radiation-receiving semiconductor component whose spectral sensitivity is adapted particularly well to the spectral sensitivity of the human eye. In another aspect, the invention specifies an optoelectronic device comprising such a radiation-receiving semiconductor component.

In accordance with at least one embodiment of the radiation-receiving semiconductor component, the latter comprises a semiconductor body, which is formed with silicon. That is to say, the semiconductor body of the radiation-receiving semiconductor component is based on silicon. It comprises, for example, at least one p-n junction formed with a p-doped region of the semiconductor body formed with silicon and an n-doped region of the semiconductor body formed with silicon. In this case, the semiconductor body can consist of silicon, apart from the dopants.

In particular, the region of the semiconductor body in which electromagnetic radiation is absorbed and converted to electric current then consists of silicon, apart from the dopants.

In accordance with at least one embodiment of the radiation-receiving semiconductor component, the semiconductor body of the radiation-receiving semiconductor component comprises a radiation entrance area. The radiation entrance area of the semiconductor body is formed, for example, by a main area, for example, at a top side of the semiconductor body. Electromagnetic radiation to be detected enters into the semiconductor body through the radiation entrance area.

In accordance with at least one embodiment of the radiation-receiving semiconductor component, the semiconductor body has an absorption zone, in which electromagnetic radiation passing into the semiconductor body through the radiation entrance area is absorbed. In this case, only electromagnetic radiation absorbed in the absorption zone contributes to the generation of an electric current and thus to the generation of a signal of the radiation-receiving semiconductor component.

Electromagnetic radiation absorbed in regions other than the absorption zone does not contribute to the signal of the radiation-receiving semiconductor component. The electromagnetic radiation is absorbed, for example, in regions of the semiconductor body which lie outside the absorption zone. In this case, the absorption zone can directly adjoin the radiation entrance area of the semiconductor body. That is to say that if the radiation entrance area is situated, for example, in a main area of the semiconductor body which lies at a top side of the semiconductor body, then the absorption zone can extend from the radiation entrance area as far as a specific depth into the semiconductor body. That is to say that the absorption zone then extends from the radiation entrance area at the top side of the semiconductor body as far as a certain depth in the direction of the underside of the semiconductor body, the underside facing away from the top side.

In accordance with at least one embodiment of the radiation-receiving semiconductor component, the absorption zone has a thickness of at most 10 µm. Preferably, the absorption zone has a thickness of between 1.5 and 7.5 µm, particularly preferably between at least 2 µm and at most 5 µm. Such a thin absorption zone ensures, for example, that the maximum sensitivity of the radiation-receiving semiconductor component is shifted from relatively long wavelengths in the range of between 800 and 900 nm into a range of shorter wavelengths of between 500 and 600 nm, for example. That is to say that the thin absorption zone absorbs radiation having a shorter wavelength with a higher probability than radiation having a longer wavelength. The non-absorbed electromagnetic radiation can penetrate through the absorption zone and be absorbed, for example, in a region of the semiconductor body in which it cannot contribute to the signal formation of the radiation-receiving semiconductor component.

In this case, the thickness of the absorption zone is measured, for example, in a direction that is perpendicular to the radiation entrance area of the radiation-receiving semiconductor component. By way of example, the direction can also be the growth direction of the epitaxially deposited part of the semiconductor body.

In accordance with at least one embodiment of the radiation-receiving semiconductor component, the radiation-receiving semiconductor component comprises a filter layer, which is formed with a dielectric material, wherein the filter layer covers the radiation entrance area of the semiconductor body. In this case, the filter layer is formed, for example, from a sequence of dielectric material layers. That is to say that the filter layer can consist of a plurality of layers arranged one above another. By way of example, the layers can extend parallel to the radiation entrance area of the semiconductor body. The individual layers of the filter layer can be formed from different dielectric materials that are arranged alternately one above another in order to form a filter layer.

The filter layer is, for example, an interference filter, embodied as a cut-off filter, or a reflection filter. The filter layer preferably completely covers the radiation entrance area of the semiconductor body, such that all electromagnetic radiation that penetrates into the semiconductor body through the radiation entrance area thereof has previously passed through the filter layer and has been filtered by the latter.

The filter layer is suitable, for example, for filtering electromagnetic radiation in the wavelength range of red light or infrared radiation, in particular, from the near infrared with wavelengths of between 800 nm and 1100 nm, that is to say suitable for preventing the radiation from penetrating into the semiconductor body, or for at least attenuating the radiation in terms of its intensity.

In accordance with at least one embodiment of the radiation-receiving semiconductor component, the radiation-receiving semiconductor component comprises a potting body which covers the semiconductor body at least at its radiation entrance area. The potting body is formed, for example, with a silicone or an epoxy resin and arranged on the semiconductor body in such a way that it completely covers the radiation entrance area of the semiconductor body. That is to say that all electromagnetic radiation which penetrates into the semiconductor body through the radiation entrance area has passed through the potting body before penetrating the semiconductor body. In this case, the potting body preferably contains a radiation-absorbing material. That is to say that, before entering into the semiconductor body, the electromagnetic radiation passes through the potting body containing the radiation-absorbing material, which absorbs part of the radiation, preferably in a wavelength-selective manner.

In accordance with at least one embodiment of the radiation-receiving semiconductor component, the semiconductor component comprises a semiconductor body, which is formed with silicon and has a radiation entrance area and also an absorption zone, in which electromagnetic radiation passing into the semiconductor body through the radiation entrance area is absorbed. In this case, the thickness of the absorption zone is at most 10 µm. The radiation-receiving semiconductor component furthermore comprises a filter layer, which is formed with a dielectric material, wherein the filter layer covers the radiation entrance area of the semiconductor body and the semiconductor component comprises a potting body, which covers the semiconductor body at least at its radiation entrance area, wherein the potting body contains a radiation-absorbing material.

In this case, the radiation-receiving semiconductor component described here is based on the insight, inter alia, that an optical detector, for example, a photodiode or a phototransistor, can be produced particularly cost-effectively on the basis of a semiconductor body formed with silicon. Furthermore, the semiconductor component is based on the insight that the combination of different measures, such as a specific thickness of the absorption zone, a filter layer and a potting body containing a radiation-absorbing material, can be suitable for adapting the spectral sensitivity of the radiation-receiving semiconductor component to the spectral sensitivity of the human eye as precisely as possible.

In accordance with at least one embodiment of the radiation-receiving semiconductor component, the filter layer is provided for filtering infrared radiation. That is to say that the filter layer is suitable for at least attenuating a portion of the electromagnetic radiation impinging on the semiconductor component, before it penetrates the semiconductor body. In this case, the filtered electromagnetic radiation has a wavelength of 800 nm or higher.

In accordance with at least one embodiment of the radiation-receiving semiconductor component, the filter layer comprises at least one layer formed from one of the following materials: silicon oxide, silicon nitrite. In this case, it is also possible for the filter layer to comprise a plurality of layers arranged one above another, for example, parallel to the radiation entrance area of the semiconductor body. In this case, the layers can differ from one another with regard to their refractive index and can form a reflector or an interference cut-off filter. By way of example, layers composed of silicon oxide and silicon nitrite are arranged one above another. The silicon oxide is preferably silicon dioxide, and the silicon nitrite is $Si_3N_4$.

In accordance with at least one embodiment of the radiation-receiving semiconductor component, the filter layer is in direct contact with the radiation entrance area of the semiconductor body. That is to say that the filter layer is arranged directly on the radiation entrance area of the semiconductor body. The filter layer can be vapor-deposited or sputtered onto the radiation entrance area, for example. For this purpose, the filter layer can comprise at least four layers, for example, wherein at least two of the layers differ from one another in terms of their refractive index. The filter layer contributes to suppressing the residual infrared sensitivity of the semiconductor body formed with silicon.

In accordance with at least one embodiment of the radiation-receiving semiconductor component, the filter layer comprises at most ten individual layers. Such a filter layer can be produced particularly cost-effectively.

In accordance with at least one embodiment of the radiation-receiving semiconductor component, the potting body is formed with at least one of the following materials: silicone, epoxy resin. Furthermore, it is also possible for the potting body to be formed with a silicone-epoxy resin hybrid material. A radiation-absorbing material, for example, in the form of particles, is then preferably introduced into the potting body. In this case, the radiation-absorbing material can be uniformly distributed in the potting body or be arranged within a layer in the latter. The radiation-absorbing material is then situated substantially only within the layer within the potting body. The layer can be completely covered at its main areas by the potting body without absorbing material. This enables a particularly precise and defined absorption of electromagnetic radiation by the radiation-absorbing material.

In accordance with at least one embodiment of the radiation-receiving semiconductor component, the radiation-absorbing material is provided for absorbing infrared radiation. That is to say that the radiation-absorbing material is suitable for absorbing infrared radiation and absorbs infrared radiation before the latter can penetrate the semiconductor body. By way of example, the radiation-absorbing material is the additive "IR-14" from Nitto.

In accordance with at least one embodiment of the radiation-receiving semiconductor component, the filter layer is arranged between the semiconductor body and the potting body. That is to say that the filter layer can, for example, completely cover the radiation entrance area of the semiconductor body, and the potting body is then arranged above the semiconductor body in such a way that it completely covers the filter layer. Electromagnetic radiation entering into the semiconductor component therefore passes completely through the potting body with the radiation-absorbing material before entering into the filter layer and completely through the filter layer before entering into the semiconductor body through the radiation entrance area. The entering electromagnetic radiation is thus subjected to a two-stage absorption or filtering process in which, for example, longer-wave portions of the electromagnetic radiation, having a wavelength above 800 nm, are at least attenuated in terms of their intensity.

In accordance with at least one embodiment of the radiation-receiving semiconductor component, the potting body is in direct contact with the filter layer at least in places. By way of example, the potting body can completely cover the filter layer and wet every free area of the filter layer, that is to say every area of the filter layer which is not in direct contact with the semiconductor body.

In accordance with at least one embodiment of the radiation-receiving semiconductor component, the potting body has a maximum thickness of 600 µm. By way of example, the potting body has a thickness of at least 200 µm and at most 500 µm. Such a thin potting body ensures that as little material as possible of the potting body is necessary for its production.

Furthermore, an optoelectronic device comprising such a radiation-receiving semiconductor component is specified. That is to say that all the features of the radiation-receiving semiconductor component are also disclosed for the optoelectronic device.

In accordance with at least one embodiment of the optoelectronic device, the optoelectronic device comprises a connection carrier having a top side. The connection carrier can be a printed circuit board, for example.

By way of example, the connection carrier has an electrically insulating base body, into which or onto which conductor tracks and connection locations are structured. Furthermore, the connection carrier can be a carrier strip (also called leadframe) or a metal-core circuit board.

In accordance with at least one embodiment of the radiation-receiving device, the radiation-receiving semiconductor component described here is fixed on the connection carrier at the top side thereof. The semiconductor component can be soldered or adhesively bonded onto the connection carrier, for example, by the side facing away from the radiation entrance area of the semiconductor body.

In accordance with at least one embodiment of the optoelectronic device, the potting body of the radiation-receiving semiconductor component is in direct contact with the connection carrier and has a maximum thickness of 600 µm. That is to say that the connection carrier is covered by the potting body at least in places. For this purpose, the semiconductor component can be provided with the potting body, for instance by encapsulation by injection molding, for example, only after application to the connection carrier.

By way of example, the potting body is in this case in contact with the connection carrier exclusively at the top side of the connection carrier. That is to say that the entire connection carrier is not encapsulated with the potting body by injection molding, rather only a region having a maximum thickness of 600 µm around the semiconductor body is encapsulated with the potting body by injection molding. As a result, the material of the potting body can be reduced compared with complete encapsulation of the connection carrier by injection molding. The radiation-absorbing material in the potting body can also be introduced in a particularly controlled manner, for example, into a layer which covers the filter element, in this way.

BRIEF DESCRIPTION OF THE DRAWINGS

The radiation-receiving semiconductor component described here and the optoelectronic device described here are described in greater detail below on the basis of exemplary embodiments and the associated figures.

Elements that are identical, of identical type or act identically are provided with the same reference symbols in the figures. The figures and the size relationships of the elements illustrated in the figures among one another, should not be regarded as to scale. Rather, individual elements may be illustrated with an exaggerated size in order to allow better illustration and/or in order to afford a better understanding.

DETAILED DESCRIPTION OF ILLUSTRATIVE EMBODIMENTS

Ambient light sensors are intended to measure the ambient brightness in an identical manner to the human eye. The spectral sensitivity of the human eye is described by the so-called V-λ curve, a sensitivity curve that begins at a wavelength λ≈400 nm and has its maximum at λ≈550-560 nm and then decreases to 0 again by λ=780 nm. Technical photodetectors initially have a sensitivity curve that deviates therefrom, which leads to corresponding incorrect measurements in comparison with the sensitivity curve of the human eye. Expensive measures are often required for adaptation to the eye curve of the technical photodetectors.

In this case, there are various approaches for producing ambient light sensors. Many semiconductor bodies, for example, semiconductor bodies composed of silicon, have a greatly deviating sensitivity curve that deviates greatly from the sensitivity curve of the human eye. On the other hand, ambient light sensors based on silicon are distinguished by the fact that they can be produced particularly cost-effectively.

Figure 1:
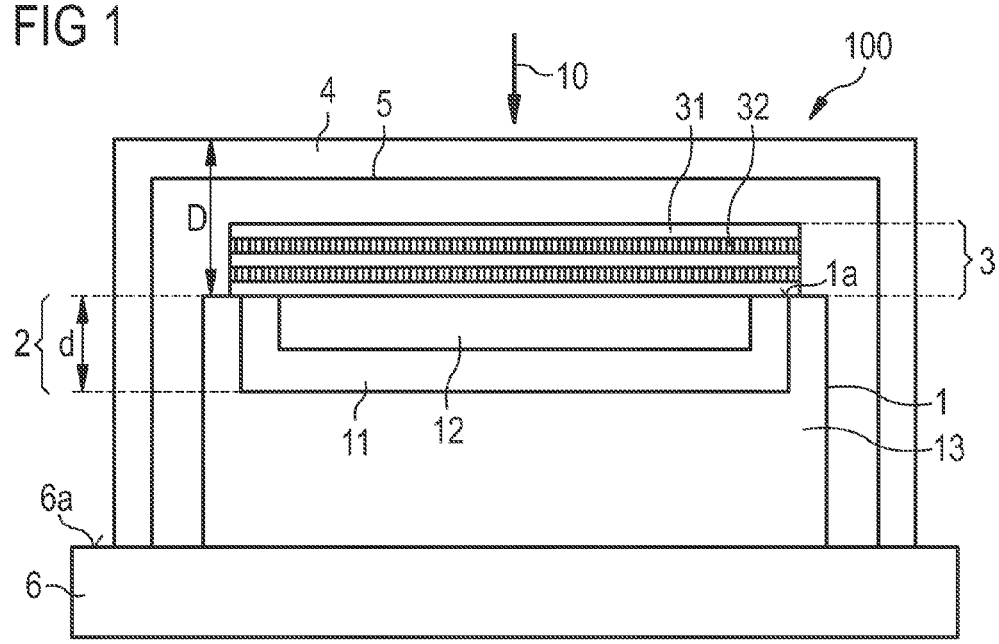
FIG. 1 shows an optoelectronic device described here comprising a radiation-receiving semiconductor component described here in accordance with one exemplary embodiment in a schematic sectional illustration.

In conjunction with FIG. 1, an optoelectronic device described here comprising a radiation-receiving semiconductor component 100 described here is explained in greater detail on the basis of a schematic sectional illustration. The semiconductor component 100 comprises a semiconductor body 1.

The semiconductor body 1 has a radiation entrance area 1a, through which electromagnetic radiation 10 passing into the semiconductor body 1 has to pass in order to be detected in the absorption zone 2 of the semiconductor body and to generate a signal. In the present case, the absorption zone 2 has a thickness d of at most 10 µm, here 3 µm, for example. In the present case, the thin absorption zone is realized by a p-n-p structure. For this purpose, the semiconductor body 1 has a first p-doped region 12, an n-doped region 11 and a second p-doped region 13. The p-n junction between the first p-doped region 12 and the n-doped region 11, the p-n junction facing the radiation entrance area 1a, serves for generating the photocurrent of the semiconductor component 100. The lower n-p junction between the n-doped region 11 and the p-doped region 13 is short-circuited, such that all charge carriers which are generated below the absorption zone 2 by incident electromagnetic radiation 10 or in some other way recombine without contributing to the photocurrent.

Alternatively, a thin absorption zone having a thickness of at most 10 µm can also be realized in other ways.

By way of example, a thin, for example, between 2 µm and 5 µm thick, relatively weakly doped epitaxial layer can be used. The absorption zone is then situated within the epitaxial layer, which is applied to a highly doped substrate, which ensures the recombination of charge carriers that occur outside the absorption zone. That is to say that the charge carriers generated in the doped substrate not only serve for generating the useful signal of the semiconductor element 103, but rather only those in the thin epitaxial layer.

As a further possibility, a thin semiconductor wafer, for example, composed of silicon, in which a p-n junction for detecting incident electromagnetic radiation is arranged, can be arranged onto a layer composed of a dielectric material. By way of the dielectric material, the thin semiconductor wafer can be bonded onto a silicon or sapphire carrier, for example. In this case, too, the volume utilized for generating the photocurrent is delimited by means of a thin absorption zone 2.

In this case, the thickness of the absorption zone 2 is measured, for example, from the radiation entrance area 1a of the semiconductor body 1 in the direction of the underside of the semiconductor body 1, the underside facing away from the radiation entrance area 1a, perpendicularly to the radiation entrance area 1a.

The filter layer 3 is arranged directly on the radiation entrance area 1a of the semiconductor body 1. The filter layer 3 completely covers the radiation entrance area 1a, such that all electromagnetic radiation 10 that penetrates the semiconductor body 1 has to pass through the filter layer. In the present case, the filter layer is a particularly simple optical filter layer having a maximum of ten layers, 31, 32, for example four layers in the present case. The layers 31 consist of silicon dioxide, for example, and the layers 32 consist of $Si_3N_4$, for example. In this case, the filter layer 3 filters electromagnetic radiation in a wavelength range for infrared radiation from the incident electromagnetic radiation 10. By way of example, the filter is a Bragg minor or an interference cut-off filter.

Furthermore, it is possible for the filter layer to consist of a photoresist that is colored. Furthermore, a metallic filter layer containing silver, for example, can be involved.

A potting body 4 is applied directly to the filter layer 3 and directly to parts of the semiconductor body 1. The potting body 4 consists, for example, of an epoxy resin, of silicone or an epoxy resin-silicone hybrid material. A radiation-absorbing material 5 is introduced, for example, as a layer, into the potting body 4. Electromagnetic radiation 10 impinging on the semiconductor component 100 firstly passes through the potting body 4 with the radiation-absorbing material 5 before the radiation impinges on the filter layer 3. The radiation-absorbing material 5 absorbs part of the infrared radiation present in the electromagnetic radiation 10. In this case, the combination of a filter layer 3 and a radiation-absorbing material 5 in the potting body 4 makes it possible firstly to use less of the expensive radiation-absorbing material 5, and secondly to embody the filter layer 3 in a particularly simple manner, for example, with fewer than ten individual layers.

In particular, the combination of radiation-absorbing material 5 and filter layer 3 thus enables an optoelectronic semiconductor component 100 which can be produced particularly cost-effectively.

The optoelectronic semiconductor component 100 is applied on a connection carrier 6 which is a metal-core circuit board, for example. In this case, the semiconductor component 100 is adhesively bonded, for example, onto the connection carrier 6 at its top side 6a and is electrically connected to the connection carrier 6 by means of wire contacts (not illustrated in this sectional illustration).

The potting body 4 covers the connection carrier 6 only at its top side 6a so that there is a maximum thickness D of 600 μm between the top surface of the semiconductor body 1 and the top surface of the potting body 4. In this way, firstly, it is possible to use particularly little potting material of the potting body which enables the optoelectronic device to be produced cost-effectively. Secondly, the electromagnetic radiation 10 to be detected, that is to say, in particular, the portions of the electromagnetic radiation 10 which lie in the range of the human eye sensitivity curve, is hardly attenuated by such a thin potting body 4. Therefore, a strong useful signal can be generated by means of the optoelectronic device.

Figure 2A:
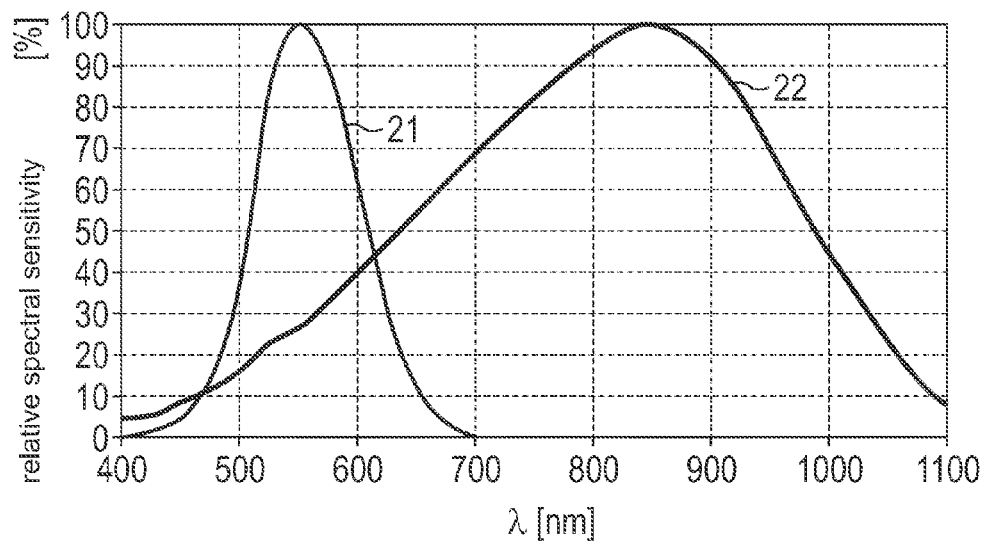
FIGS. 2A to 2C show the effects of components of the radiation-receiving semiconductor component described here, on the basis of schematic graphical plots.
Figure 2B:
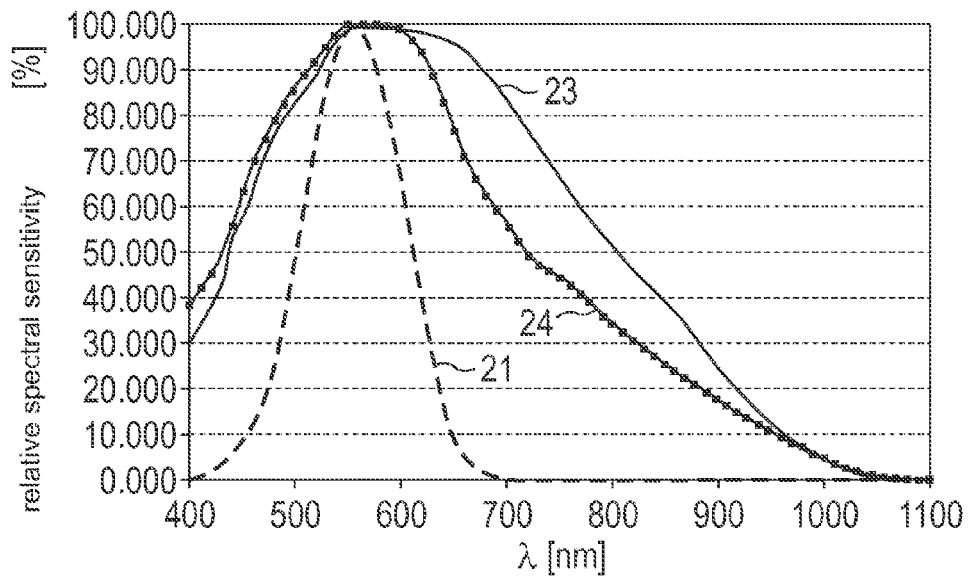
Figure 2C:
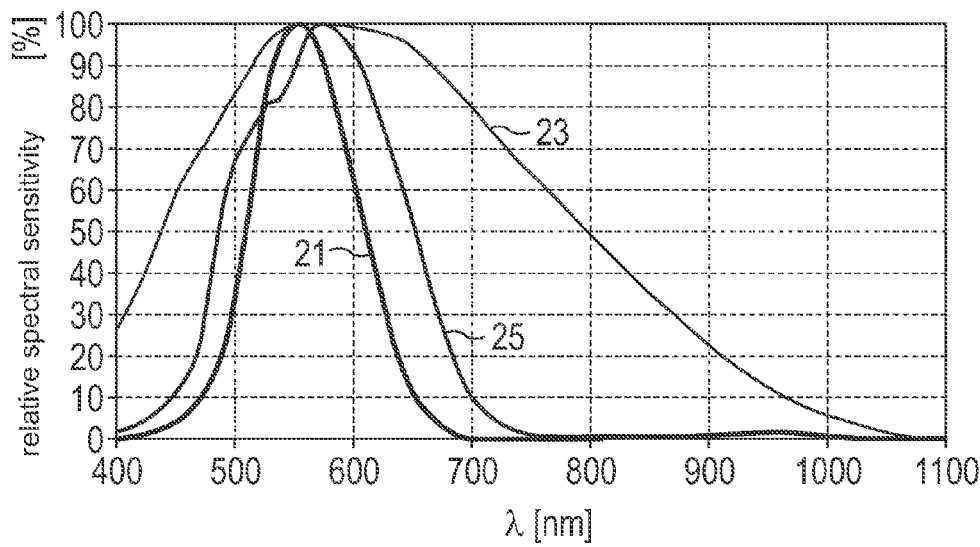

In FIGS. 2A to 2C, the relative spectral sensitivity of the human eye is in each case plotted in comparison with the relative spectral sensitivity of various radiation-receiving semiconductor components 100.

FIG. 2A firstly shows the human eye sensitivity curve 21 and also the sensitivity curve of a silicon photodiode, in which none of the measures described here was employed. That is to say that the silicon photodiode comprises neither a particularly thin absorption zone, nor a filter layer, nor a potting body with radiation-absorbing material. The maximum of the sensitivity then lies, as can be seen from curve 22, between 800 and 900 nm.

In FIG. 2B, the human eye sensitivity curve 21 is compared with two further curves 23 and 24. Curve 23 shows the sensitivity curve of a silicon photodiode in which the absorption zone 2 has a thickness of less than 10 μm. As can be seen from FIG. 2B, the very wide maximum of the sensitivity curve 23 has already shifted into the wavelength range between 500 and 600 nm.

Curve 24 shows the sensitivity curve of a silicon photodiode having a thin absorption zone 2 in which a filter layer 3 is arranged on the radiation entrance area 1a. The filter layer 3 is in this case a simple filter layer comprising at most ten individual layers.

Finally, FIG. 2C shows the relative spectral sensitivity curve 25 for a radiation-receiving semiconductor component described here, as described in conjunction with FIG. 1.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A radiation-receiving semiconductor component comprising:
   a semiconductor body comprising silicon and having a radiation entrance area and an absorption zone, wherein electromagnetic radiation passing into the semiconductor body through the radiation entrance area is absorbed in the absorption zone, wherein the absorption zone has a thickness of at most 10 μm such that a maximum sensitivity of the radiation-receiving semiconductor component is at a wavelength between 500 nm and 600 nm,
   a filter layer comprising a dielectric material, wherein the filter layer covers the radiation entrance area of the semiconductor body, the filter layer being configured to filter infrared radiation such that infrared radiation penetrating into the semiconductor body is attenuated in intensity, and
   a potting body, which covers the semiconductor body at least at its radiation entrance area, wherein the potting body contains a radiation-absorbing material.

2. The radiation-receiving semiconductor component according to claim 1, wherein the filter layer is configured to filter the infrared radiation such that substantially all infrared radiation is prevented from penetrating into the semiconductor body.

3. The radiation-receiving semiconductor component according to claim 1, wherein the filter layer comprises at least one layer formed from silicon oxide or silicon nitride.

4. The radiation-receiving semiconductor component according to claim 1, wherein the filter layer is in direct contact with the radiation entrance area of the semiconductor body.

5. The radiation-receiving semiconductor component according to claim 1, wherein the potting body contains silicone and/or epoxy resin.

6. The radiation-receiving semiconductor component according to claim 1, wherein the filter layer comprises at most ten layers.

7. The radiation-receiving semiconductor component according to claim 1, wherein the radiation-absorbing material is provided for absorbing infra-red radiation.

8. The radiation-receiving semiconductor component according to claim 1, wherein the filter layer is arranged between the semiconductor body and the potting body.

9. The radiation-receiving semiconductor component according to claim 8, wherein the potting body is in direct contact with the filter layer at least in places.

10. The radiation-receiving semiconductor component according to claim 9, wherein the potting body has a maximum thickness of 600 μm.

11. An optoelectronic device comprising
a connection carrier, having a top side,
a radiation-receiving semiconductor component, according to claim 1, which is fixed on the connection carrier at the top side thereof, wherein
the potting body of the radiation-receiving semiconductor component is in direct contact with the connection carrier and has a maximum thickness of 600 μm.

12. The optoelectronic device according to claim 11, wherein the potting body is in contact with the connection carrier exclusively at the top side of the connection carrier.

13. The radiation-receiving semiconductor component according to claim 1, wherein
the absorption zone comprises a first p-doped region, an n-doped region, a second p-doped region, a first p-n junction between the first p-doped region and the n-doped region, and a second n-p junction between the n-doped region and the second p-doped region, wherein
the first p-n junction faces the radiation entrance area and serves for generating a photocurrent of the semiconductor component, and the second n-p junction is short-circuited, such that charge carriers which are generated below the absorption zone by incident electromagnetic radiation or in some other way recombine without contributing to the photocurrent.

14. A radiation-receiving semiconductor component comprising:
a semiconductor body, comprising silicon and having a radiation entrance area and an absorption zone, wherein electromagnetic radiation passing into the semiconductor body through the radiation entrance area is absorbed in the absorption zone, wherein the absorption zone has a thickness of at most 10 μm such that a maximum sensitivity of the radiation-receiving semiconductor component is at a wavelength between 500 nm and 600 nm;
a filter layer configured to filter infrared radiation such that infrared radiation penetrating into the semiconductor body is attenuated in intensity, the filter layer comprising a dielectric material, wherein the filter layer covers the radiation entrance area of the semiconductor body; wherein the filter layer comprises a plurality of layers differing from one another in terms of their refractive index and the filter layer is an interference filter embodied as a cut-off filter such that the part of the electromagnetic radiation having a wavelength of 800 nm or higher is attenuated in terms of its intensity; and
a potting body, which covers the semiconductor body at least at its radiation entrance area, wherein the potting body contains a radiation-absorbing material configured to absorb infrared radiation.

15. The radiation-receiving semiconductor component according to claim 14, wherein
the absorption zone comprises a first p-doped region, an n-doped region, a second p-doped region, a first p-n junction between the first p-doped region and the n-doped region, and a second n-p junction between the n-doped region and the second p-doped region, wherein
the first p-n junction faces the radiation entrance area and serves for generating a photocurrent of the semiconductor component, and the second n-p junction is short-circuited, such that charge carriers which are generated below the absorption zone by incident electromagnetic radiation or in some other way recombine without contributing to the photocurrent.

16. The radiation-receiving semiconductor component according to claim 14, wherein the filtered infrared radiation has a wavelength of 800 nm or higher.

17. The radiation-receiving semiconductor component according to claim 14, wherein the filter layer comprises a plurality of layers formed from different dielectric materials, wherein the layers of the filter layer are arranged one above another.

18. The radiation-receiving semiconductor component according to claim 14, wherein the filter layer comprises a plurality of dielectric materials layers having different refractive indices, wherein the layers of the filter layer are arranged one above another in such a way that a Bragg mirror or an interference cut-off filter is formed.

19. The radiation-receiving semiconductor component according to claim 14, wherein the filter layer completely covers the radiation entrance area of the semiconductor body and the potting body is arranged above the semiconductor body in such a way that the potting body completely covers the filter layer.

20. The radiation-receiving semiconductor component according to claim 14, wherein the filter layer is configured to filter the infrared radiation such that substantially all infrared radiation is prevented from penetrating into the semiconductor body.

* * * * *